(12) United States Patent
Chen et al.

(10) Patent No.: US 9,275,294 B2
(45) Date of Patent: Mar. 1, 2016

(54) COMPRESSED SENSING USING REGIONAL SPARSITY

(75) Inventors: Xiao Chen, Charlottesville, VA (US); Li Pan, Perry Hall, MD (US)

(73) Assignee: Siemens Aktiengesellschaft, Munich (DE)

( * ) Notice: Subject to any disclaimer, the term of this patent is extended or adjusted under 35 U.S.C. 154(b) by 564 days.

(21) Appl. No.: 13/569,430

(22) Filed: Aug. 8, 2012

(65) Prior Publication Data

US 2013/0114872 A1    May 9, 2013

Related U.S. Application Data

(60) Provisional application No. 61/555,172, filed on Nov. 3, 2011.

(51) Int. Cl.
| | |
|---|---|
| *G06K 9/00* | (2006.01) |
| *G06K 9/20* | (2006.01) |
| *G06K 9/62* | (2006.01) |
| *G06T 7/00* | (2006.01) |
| *G01R 33/561* | (2006.01) |

(52) U.S. Cl.
CPC .......... *G06K 9/2054* (2013.01); *G01R 33/5611* (2013.01); *G06K 9/6249* (2013.01); *G06T 7/0081* (2013.01); *G06T 2207/20144* (2013.01)

(58) Field of Classification Search
None
See application file for complete search history.

(56) References Cited

U.S. PATENT DOCUMENTS

| 7,602,183 | B2 * | 10/2009 | Lustig et al. | 324/309 |
|---|---|---|---|---|
| 7,916,828 | B1 * | 3/2011 | Khare et al. | 378/4 |
| 8,553,964 | B2 * | 10/2013 | Chefd'hotel et al. | 382/131 |
| 2011/0142316 | A1 * | 6/2011 | Wang et al. | 382/131 |
| 2012/0063659 | A1 * | 3/2012 | Wang et al. | 382/131 |
| 2012/0148128 | A1 * | 6/2012 | Chefd'hotel et al. | 382/131 |
| 2012/0315461 | A1 * | 12/2012 | Mehrabi et al. | 428/306.6 |

OTHER PUBLICATIONS

Sparse MRI: The Application of Compressed Sensing for Rapid MR Imaging Michael Lustig,1 David Donoho,2 and John M. Pauly1 ; Jul. 2007.*
Canoes, Emmanuel et al., "Robust Uncertainty Principles: Exact Signal Reconstruction from Highly Incomplete Frequency Information", IEEE Transactions on Information Theory, 2006;52(2):489-509.
Donoho David L. "Compressed Sensing", IEEE Transactions on Information Theory, 2006;52(4), pp. 1288-1306.
Lustig, Michael et al., "Compressed Sensing MRI", IEEE Signal Processing Magazine, 2008; 25(2): 72-82.
Knopp, Tobias., et al, "A note on the iterative MRI reconstruction from nonuniform k-space data", Int. J. Biome. Imag. 2007. doi: 10.1155/2007/24727.
El-Metwally S.M. et al., "Rapid Cardiac MRI Using Random Radial Trajectories", Journal of Engineerng and Applied Science, vol. 55 No. 5, Oct. 2008, pp. 441-456.

(Continued)

*Primary Examiner* — Nancy Bitar

(57) ABSTRACT

A method for reconstructing an image includes acquiring raw image data during a scan of an area, estimating an image from the raw image data, separating the estimated image into a region of interest (ROI) and a background region, and applying compressed sensing to iteratively update only the ROI and maintain the background region to reconstruct an image.

20 Claims, 9 Drawing Sheets

(56) References Cited

OTHER PUBLICATIONS

Lustig, Michael et al., Sparse MRI: The Application of Compressed Sensing for Rapid MR Imaging, Magnetic Resonance in Medicine, 2007;58(6):1182-95.

Yang Junfeng et al., "A Fast Alternating Direction Method for TVL1-L2 Signal Reconstruction From Partial Fourier Data", IEEE Journal of Selected Topics in Signal Processing, 2010:4(2), pp. 288-297.

* cited by examiner

COMPRESSED SENSING USING REGIONAL SPARSITY

CROSS-REFERENCE TO RELATED APPLICATIONS

This application claims priority to U.S. Provisional Application No. 61/555,172 filed on Nov. 3, 2011, the disclosure of which is incorporated by reference herein.

BACKGROUND OF THE INVENTION

1. Technical Field

The present disclosure relates generally to acquisition of imaging signal and reconstruction of images from the acquired signals, and more particularly to acquisition and reconstruction of images using compressed sensing techniques.

2. Discussion of Related Art

Magnetic resonance imaging (MRI) is a non-invasive diagnostic imaging procedure that uses nuclear magnetization and radio waves to produce internal images of a patient. An MRI scanner contains magnetic coils that create a strong static magnetic field in which the patient is positioned. Certain atoms in a patient's body that were previously randomly-ordered become aligned along the magnetic field. The scanner then sends a series of bursts or pulses of radio frequency (RF) energy through the patient's body part under examination that excite the "ordered" atoms to specific oscillations around the magnetic field. The atoms generate an RF signal during the pulsed oscillations and as the atoms return to their respective alignments. The scanner detects the RF signals by appropriate reception or pick-up coils and uses gradient coils to generate non-homogeneous magnetic fields to enable the signals to be spatially coded in all three spatial directions. The scanner processes the coded signals or data to transform them into a visual representation of the scanned patient's body part. In particular, the scanner samples and digitizes the signals, creates a so-called k-space data matrix filled with the digitized complex values of each signal, and generates for display and/or other usage a corresponding MR image from the k-space data matrix by means of a complex Fourier transform. The MRI scanner acquires three-dimensional image data of the patient's body part for respective "slices" of an area of the body part. The scanner repeats a pre-defined MR image pulse sequence, i.e., the above-described steps for collecting the signals/data, a number of times to collect sufficient data from the excitations to reconstruct the specific image. Ideally, there are little or no variations in the nuclear magnetization during the excitations.

Image acquisition may be performed under time-sensitive conditions to ensure that there is no movement of the subject during the image acquisition process. Thus, image acquisition may be performed while the patient refrains from moving. Often this is requires the patient holding his breath. When the MRI is used to track cardiac motion, acquisition time needs to be quick.

In light of this shortened acquisition time, it may be difficult to acquire data at the Nyquist rate to ensure sufficient sampling for ideal image reconstruction. Accordingly, performing accurate reconstruction with less than an ideal amount of data may be difficult. This difficulty in reconstructing an image under these conditions may be similar to trying to solve for a system of linear equations in which there are more unknown variables then there are equations. In such a case, there may be an infinite number of possible solutions.

Compressed sensing (CS) techniques have been developed to aid in reconstructing a signal using a sampling rate that is below the Nyquist sampling rate. These techniques exploit the observation that most practical signals of interest have sparse representations using a specific transform. Thus, for a given signal, there may exist a particular transform space in which a majority of the transform coefficients are at or near zero. This transform space may be referred to as the sparsity space. As these small coefficients may be assumed to be zero without significant loss of signal quality (the sparseness assumption), signal reconstruction may be approximated by determining only the limited set of large transform coefficients for the sparsity space.

In standard MRI acquisition, oversampling may be performed along a frequency encoding (or readout) direction to avoid aliasing (or wrapping) artifacts. In radial trajectory acquisition, the oversampling may be performed in each "readout" direction of radial spokes. This oversampling is usually not an issue for a modern scanner and does not increase the total reconstruction time. However, for CS reconstruction, it is quite time-costly due to non-linear iterative optimization involved to process the extra oversampled data. The time spent on reconstructing the peripheral background is considered time wasted since in most cases they are zeros or close to zero (e.g., background noise), and will be thrown away at the end of reconstruction.

Thus, there is a need for methods and systems that can improve CS reconstruction.

SUMMARY OF THE INVENTION

According to an exemplary embodiment of the invention, a method for reconstructing an image includes estimating an image from acquired raw image data, separating the estimated image into a region of interest (ROI) and a background region; and applying compressed sensing to iteratively update only the ROI and maintain the background region to reconstruct an image.

In an embodiment, the background entirely surrounds the ROI.

In an embodiment, the separating further separates the estimated image into a second ROI distinct from the first ROI, and the applying comprises applying the compressed sensing to iteratively update the ROI using a first sparsity constraint and iteratively update the second ROI using a second other sparsity constraint.

According to an exemplary embodiment of the invention, a method for reconstructing an image includes generating a cost function including a fidelity term and a sparsity term and minimizing the generated cost function to generate a reconstructed is image. The fidelity term includes a difference between a transform of an estimated image and raw image data. The sparsity term includes a mask multiplied by the estimated image that retains a region of interest (ROI) of the estimated image and masks out a background of the estimated image.

BRIEF DESCRIPTION OF THE DRAWINGS

Exemplary embodiments of the invention can be understood in more detail from the following descriptions taken in conjunction with the accompanying drawings in which.

DETAILED DESCRIPTION

Exemplary embodiments of the invention are discussed in further detail with reference to FIGS. 1-6. This invention may, however, be embodied in different forms and should not be construed as limited to the embodiments set forth herein.

It is to be understood that the systems and methods described herein may be implemented in various forms of hardware, software, firmware, special purpose processors, or a combination thereof. In particular, at least a portion of the present invention may be implemented as an application comprising program instructions that are tangibly embodied on one or more program storage devices (e.g., hard disk, magnetic floppy disk, RAM, ROM, CD ROM, etc.) and executable by any device or machine comprising suitable architecture, such as a general purpose digital computer having a processor, memory, and input/output interfaces. It is to be further understood that, because some of the constituent system components and process steps depicted in the accompanying Figures may be implemented in software, the connections between system modules (or the logic flow of method steps) may differ depending upon the manner in which the present invention is programmed. Given the teachings herein, one of ordinary skill in the related art will be able to contemplate these and similar implementations of the present invention.

Figure 1:
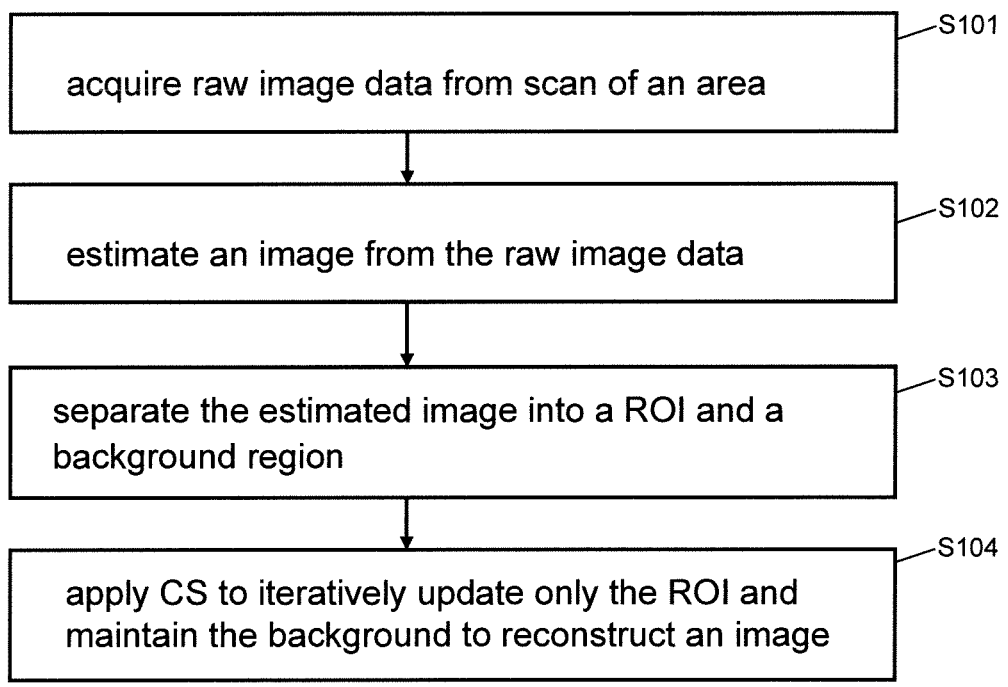
FIG. 1 illustrates a method of performing image reconstruction according to an exemplary embodiment of the invention.

FIG. 1 illustrates a method of performing CS reconstruction according to an exemplary embodiment of the invention. Referring to FIG. 1, the method includes: acquiring raw image data during a scan of an area (S101). The scanned area could be various objects such as a human body, an animal body, a shipping container, luggage, etc.

For example, one of various imaging scanning modalities can be used to scan the area to acquire the raw image data, such as MRI, computed tomography (CT), positron emission tomography (PET), etc.

In MRI, the raw image data may correspond to the 2D or 3D Fourier transform of the MR image measured (i.e., k-space). Its complex values are sampled during an MR measurement, in a premeditated scheme controlled by a pulse sequence, i.e., an accurately timed sequence of radiofrequency and gradient pulses. When the k-space is full (e.g., at the end of a scan), the data is ready to be processed to produce a final image. The raw image data may be acquired using Cartesian or non-Cartesian acquisition schemes. When the non-Cartesian acquisition scheme is used, the resulting raw image data may be gridded data.

Referring back to FIG. 1, the method includes estimating an image from the raw image data (S102). For example, if the area had been scanned using MRI, an inverse Fourier transform can be performed on the k-space data to generate the estimated image. However, if the area had been scanned using CT, a back-projection technique could have been used to generate the estimated image. For other imaging modalities, different techniques can be used to generate the estimated image.

Had the raw image data been acquired using MRI and a non-Cartesian coordinate system, the estimation of the image could be performed by performing an inverse Fourier transform on the gridded k-space data.

Next, the method includes separating the estimated image into a region of interest (ROI) and a background region (S103). In an exemplary embodiment, the ROI is a center region and the background region is a peripheral region entirely surrounding the center region. However, the invention is not limited to any particular location or shape for the ROI and the background region. Masks can be applied to the estimated image to filter out the ROI and the background region. The use of these masks will be described in more detail below. Next, the method includes applying compressed sensing (CS) to iteratively update only the ROI and maintain the background region to reconstruct an image (S104).

CS requires (1) signals or images to be sparse or compressible; (2) a random sampling scheme; and (3) a non-linear optimization scheme to reconstruct the images. However, a truly random sampling of the k-space (e.g., spatial frequency space when MRI is used) of images may be impractical. Both Cartesian and non-Cartesian acquisition schemes can be used to pseudo-randomly sample the k-space. However, a non-Cartesian acquisition scheme may achieve higher randomness than the Cartesian scheme. A radial trajectory acquisition is an example of the non-Cartesian acquisition scheme.

In an MRI radial trajectory acquisition, MR raw age data (e.g., data points having frequency/phase coordinates) is acquired along radial spokes. As discussed above, the acquired MR raw image data may be referred to as k-space data. However, since the k-space data captured during radial trajectory acquisition is along radials, their coordinates are typically non-integer values. Integer valued coordinates are then obtained using gridding since they are required for a Fast Fourier transform (FFT). Gridding is a method of interpolating data to a uniform grid, which can be used to generate gridded k-space data.

CS, also known as compressive sensing, compressive sampling, and sparse sampling, is a technique for finding sparse solutions to underdetermined linear systems. An underdetermined system of linear equations has more unknowns than equations and generally has an infinite number of solutions. However, if there is a unique sparse solution to the underdetermined system that presents sparsity in a certain space, then the CS framework allows the recovery of that solution. CS typically starts with taking a weighted linear combination of samples (compressive measurements) in a basis different from the basis in which the signal is known to be sparse. Therefore, the task of converting the image back into the intended domain involves solving an underdetermined matrix equation. By adding the sparsity constraints, even the number of compressive measurements taken is smaller than the number of pixels in the full image.

Use of CS to reconstruct an image is an optimization problem. According to an exemplary embodiment of the invention, CS can reconstruct an image by minimizing the below cost function shown by the following equation 1:

$$f(\hat{m}) = \|\Im\hat{m} - d\|_2 + \lambda\|\Psi\hat{m}\|_1 \quad (1)$$

where $\hat{m}$ is an estimated image, $\Psi$ is a sparsity transform, d is gridded measured/acquired k-space data, $\Im$ is a Fourier transform, and $\lambda$ is a weighting factor. However, in an alternate embodiment, the gridded k-space data 'd' is replaced with the k-space data (i.e., the k-space data is not gridded). When an image modality other than MRI is used, the $\Im$ stands for the corresponding transform or technique that is used with that modality (e.g., back-projection with CT). The sparsity transform $\Psi$ applies a transform to the estimated image $\hat{m}$ to yield a sparse result. In an embodiment, the sparsity transform $\Psi$ is a spatial total variance and is applied to the estimated image $\hat{m}$.

The acquiring step S101 may perform an oversampling during its acquisition of the raw image data. Oversampling is the process of sampling a signal with a sampling frequency higher than twice the bandwidth or highest frequency of the signal being sampled. However, this oversampling can result in a doubled field of view (FOV) in the oversampling directions (e.g., in the radial sampling case, 4 times larger than the defined FOV) where the ROI occupies only part of the entire sampled region while the remaining "background" region occupies the remainder of the sampled region. The "background" region is then chopped off and only the ROI is maintained as reconstruction results. For Cartesian acquisition, the oversampling can result in a doubled FOV in the frequency direction.

Figure 2:
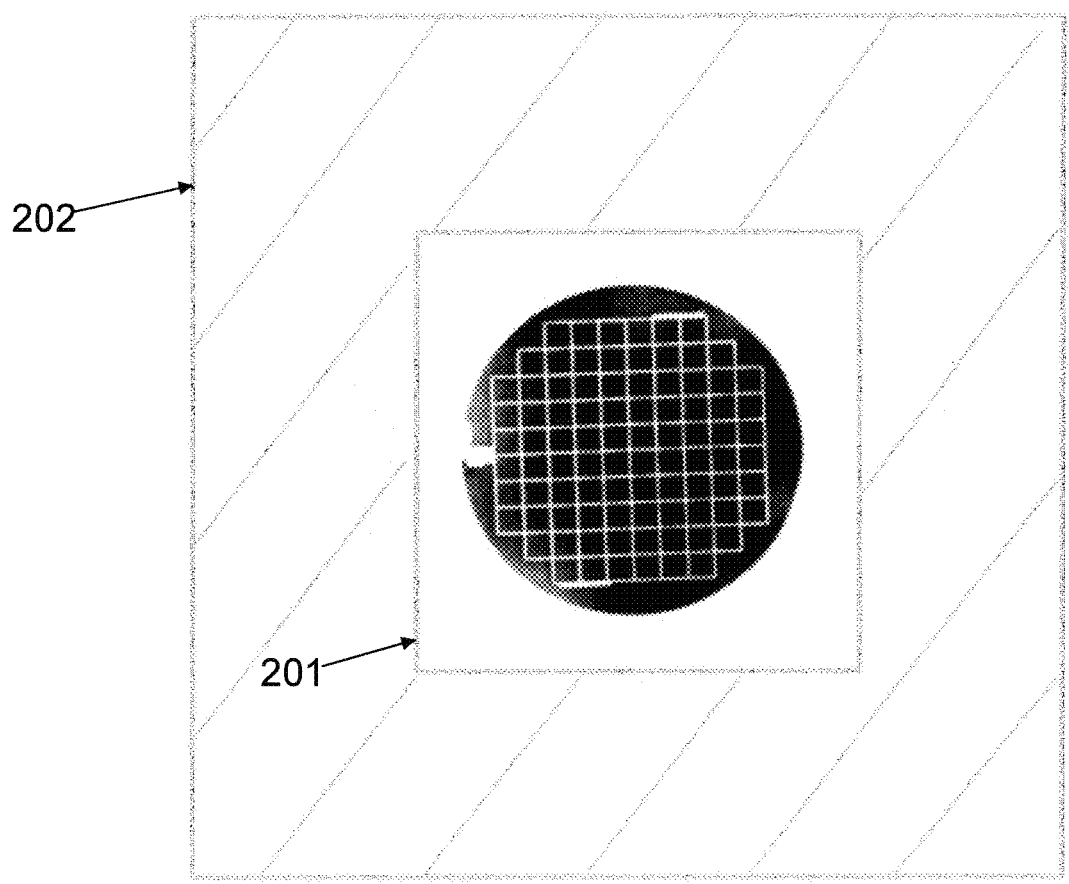
FIG. 2 illustrates an example of a region of interest (ROI) and a background of the ROI that may be used in reconstruction of an image according to the method of FIG. 1.

FIG. 2 illustrates an example of a ROI 201 and a background region 202 due to oversampling that may be used in the reconstruction method of FIG. 1. While FIG. 2 illustrates the ROI 201 as a "Center" region and the background region 202 as a "Peripheral" region surround the "Center region", embodiments of the invention are not limited thereto. For example, the background region 202 need not entirely surround the ROI 201, and the ROI 201 can have various shapes and location within the field of view.

While extra oversampled data can be handled by a fast Fourier transform reconstruction, it is extremely computation-expensive for CS reconstruction, which involves iterative calculations to solve the above non-linear optimization problem shown in equation 1.

The time spent on reconstructing the peripheral background is considered time wasted since in most cases they are zeros or close zeroes (background noise) and will be thrown away at the end of the reconstruction.

To effectively reduce the amount of data to be processed in order to decrease reconstruction time, an exemplary embodiment of the invention applies a regional sparsity approach into CS reconstruction. As discussed above with respect to step S103, the estimated image is separated into two parts, its ROI and a "background" region. For example, the ROI is distinct from the background region. Then as discussed above with respect to step S104, only the ROI is calculated and updated through the CS calculation while the "background region" (e.g., due to oversampling) is kept the same as the initial estimation of the image. However, all the measured k-space data is still used so all the acquired "true" information is kept through the reconstruction.

The below describes how the regional sparsity approach is applied to generate a modified version of the cost function shown in equation 1, according to an exemplary embodiment of the invention.

The estimated image $\hat{m}$ in the cost function can be replaced by the terms on the right side of equation 2 according to an exemplary embodiment as follows:

$$\hat{m} = W_c \hat{m} + W_p \hat{m}_0 \quad (2)$$

where $W_c$ and $W_p$ are ROI and "background" masks respectively, with $W_c \cap W_p = \Theta$ and $W_c \cup W_p = I$. In this way, instead of a current estimate of an image being based on its ROI and background parts, it is based on its ROI part and the background part of its initial estimate. In an embodiment, the ROI mask $W_c$ is a matrix of 1s and 0s, where the 0s correspond in location to the background region and the 1s correspond in location to the ROI. For example, when the ROI mask $W_c$ is multiplied by an estimated image, the ROI of the image is retained, and the background part of the image is filtered out. In an embodiment, the background mask $W_p$ is a matrix of 1s and 0s, where the 1s correspond in location to the background region and the 0s correspond in location to the ROI. For example, when the background mask $W_p$ is multiplied by an estimated image, the background part is retained and the ROI part is filtered out.

Due to equation 2, during an initial iteration of minimizing the cost function of equation 1, a calculation is performed that includes a multiplying the background mask $W_p$ by the initial estimated image $\hat{m}_0$ to generate a second term, multiplying the center mask $W_c$ by the initial estimated image $\hat{m}_0$ to generate a first term, and summing the first and second terms and the negative of the gradient of the cost function to generate the current estimated image $\hat{m}_1$. However, since the second term is already known, a second iteration of the minimizing need only update the first term by multiplying the center mask $W_c$ by the current estimated image $\hat{m}_1$, and then sum the original second term with the updated first term arrive at the updated estimated image $\hat{m}_2$. Further, all subsequent iterations of the minimizing update the estimated image in a similar manner to the second iteration. For example, all subsequent iterations re-use the second term and update the first term.

In one embodiment, the gradient of $f(\hat{m})$ is calculated as $\nabla f(\hat{m})$, and the current estimated image $\hat{m}_{i+1}$ is generated from a sum of the prior ith estimate and the negative of the gradient as shown by equation 3

$$\hat{m}_{i+1} = W_p \hat{m}_i + W_c \hat{m}_0 - W_c \nabla f(\hat{m}_i) \quad (3)$$

The initial estimated image $\hat{m}_0$ may be given by equation 4 as follows:

$$\hat{m}_0 = \Im^{-1} d \quad (4)$$

which shows that the initial estimated image $\hat{m}_0$ is the inverse Fourier transform of gridded k-space data d. However, in an alternate embodiment, the initial estimated image $\hat{m}_0$ is the inverse Fourier transform of the k-space data. When imaging modalities other than MRI are used, the inverse Fourier transform may be replaced with a transform that is suitable for the corresponding modality (e.g., back-projection for CT).

According to an exemplary embodiment of the invention, the cost function of equation 1 is modified to a regional sparsity cost function as shown by the following equation 5.

$$f(\hat{m}) = \|\Im \hat{m} - d\|_2 + \lambda \|\Psi W_c \hat{m}\|_1 \quad (5)$$

In the new cost function of equation 5, only the sparsity of the ROI of the estimated image $\hat{m}$ is considered and calculated. For example, the ROI mask $W_c$ is applied to (multiplied by) the estimated image in the second term of equation 1 to arrive at equation 5.

Next, in the embodiment, the estimated image $\hat{m}$ of the first term in equation 5 is replaced with $\hat{m} = W_c \hat{m} + W_p \hat{m}_0$ from equation 2, and the gridded k-space data d is replaced with $\Im \hat{m}_0$ since $d = \Im \hat{m}_0$, which results in the following equation 6:

$$f(\hat{m}) = \|\Im(W_c \hat{m} + W_p \hat{m}_0) - \Im \hat{m}_0\|_2 + \lambda \|\Psi W_c \hat{m}\|_1. \quad (6)$$

Equation 6 can then be re-written as equation 7 when $\hat{m}_0$ is replaced with $W_c \hat{m}_0 + W_p \hat{m}_0$ as follows:

$$f(\hat{m}) = \|\Im(W_c \hat{m} + W_p \hat{m}_0) - \Im(W_c \hat{m}_0 + W_p \hat{m}_0)\|_2 + \lambda \|\Psi W_c \hat{m}\|_1. \quad (7)$$

Equation 7 can then be simplified to equation 8 to generate the final regional sparsity cost function as follows:

$$f(\hat{m}) = \|\Im W_c(\hat{m}-\hat{m}_0)\|_2 + \lambda \|\Psi W_c \hat{m}\|_1. \quad (8)$$

As shown by equation 8, CS is only applied on the ROI defined by the ROI mask $W_c$. Using this regional sparsity approach, CS reconstruction quality may be well-maintained and the time consumed by reconstruction may be reduced. This approach can be used in real-time imaging applications where the reconstruction time is desired to be less than acquisition time for incoming real-time images to avoid delay between measurements.

Further, the regional sparsity approach may be extended to a CS reconstruction where only part of the images are considered sparse and are of interest in the final result. In equation (8), the ROI mask $W_c$ can be generally defined as the region of interest of the image. By applying the mask, regional sparsity based CS reconstruction is only performed on the ROI. This not only saves reconstruction time, but also offers the possibility to apply different sparsity to different regions on one image.

Figure 3A:
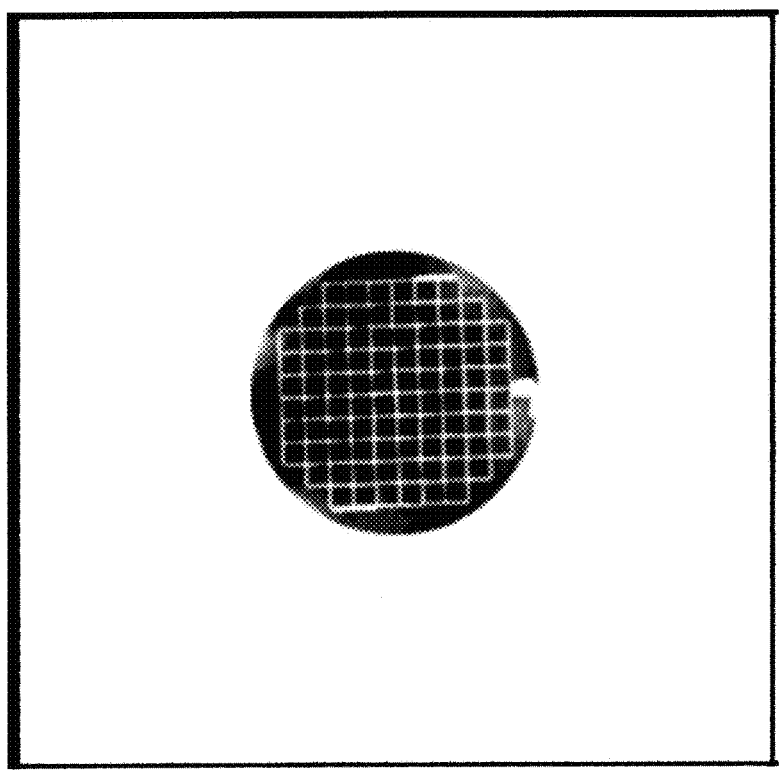
FIGS. 3a, 3b, 3c, 3d illustrate a comparison between results obtained using a conventional CS image reconstruction method without separating different regions of image and a CS image reconstruction method according to an exemplary embodiment of the invention.

FIGS. 3a-3d illustrates a comparison between results obtained using a CS approach without masks and results obtained using a CS approach according to at least one embodiment of the invention (hereinafter referred to as the "regional sparsity approach"). FIG. 3a illustrates a result of applying a CS calculation in both the ROI and "background" region according to the conventional approach.

Figure 3B:
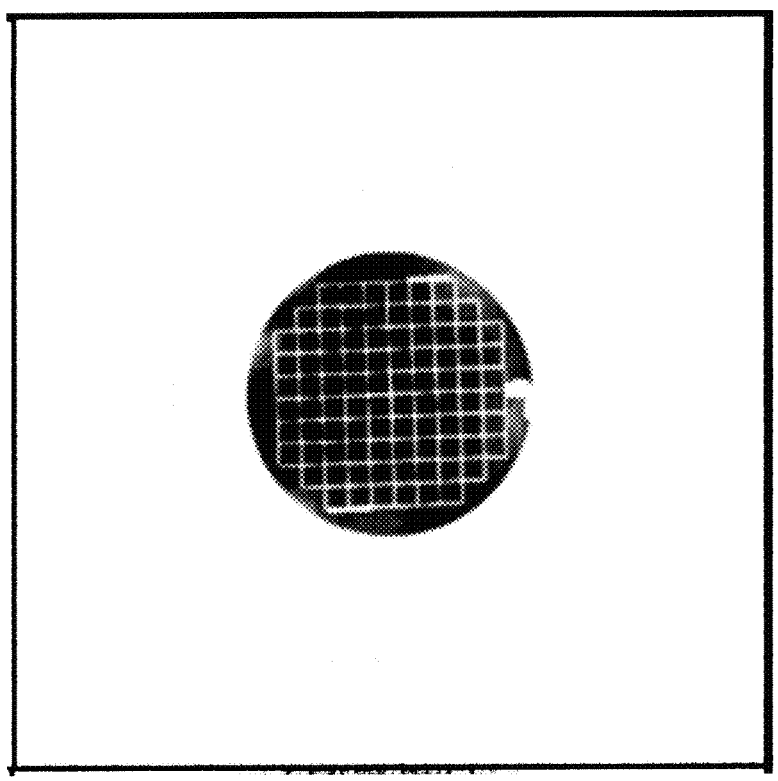

FIG. 3b illustrates a result of applying the regional sparsity approach by applying the CS calculation in only the ROI.

Figure 3C:
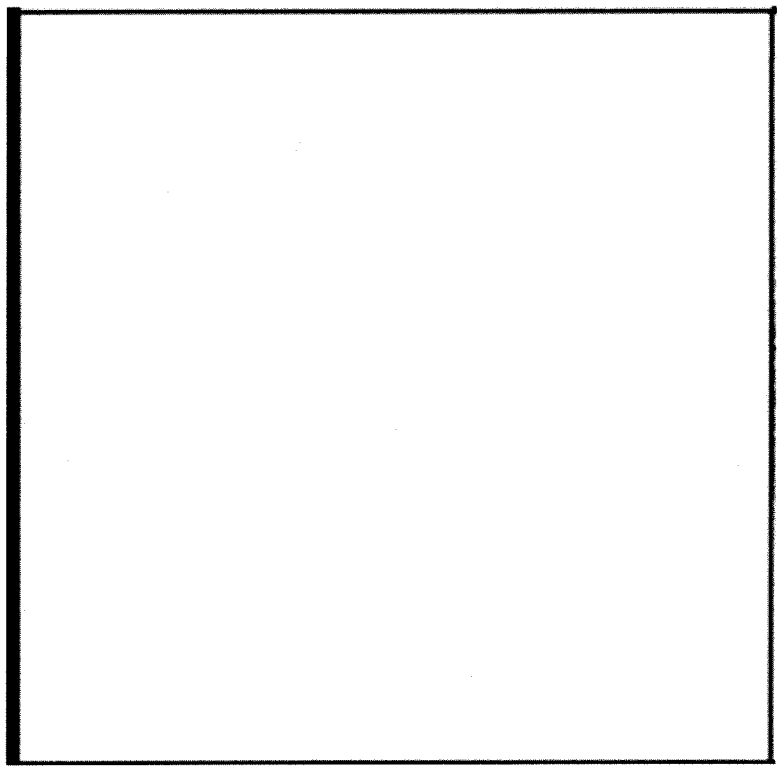
Figure 3D:
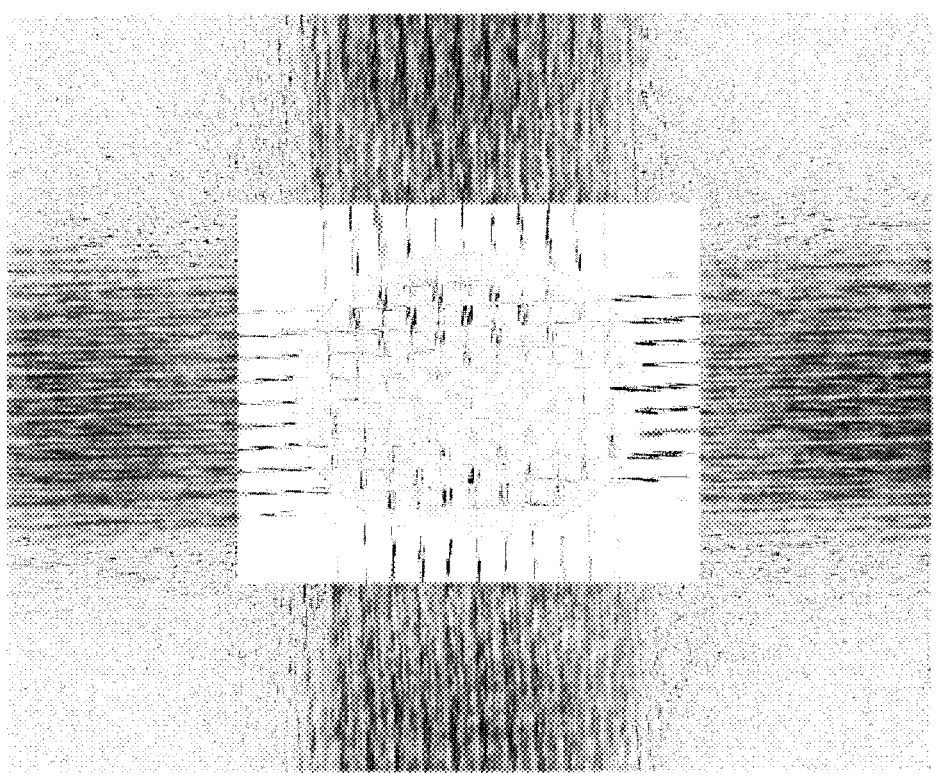

FIG. 3c illustrates a difference image between images of FIG. 3a and FIG. 3b. As shown by FIG. 3c the results achieved from using the CS approach without masks differ minimally from the results achieved by using the regional sparsity approach within the region of interest. FIG. 3d illustrates the difference image of FIG. 3c magnified 10 times, to emphasis that the results from both approaches are quite similar within ROI.

Figure 4:
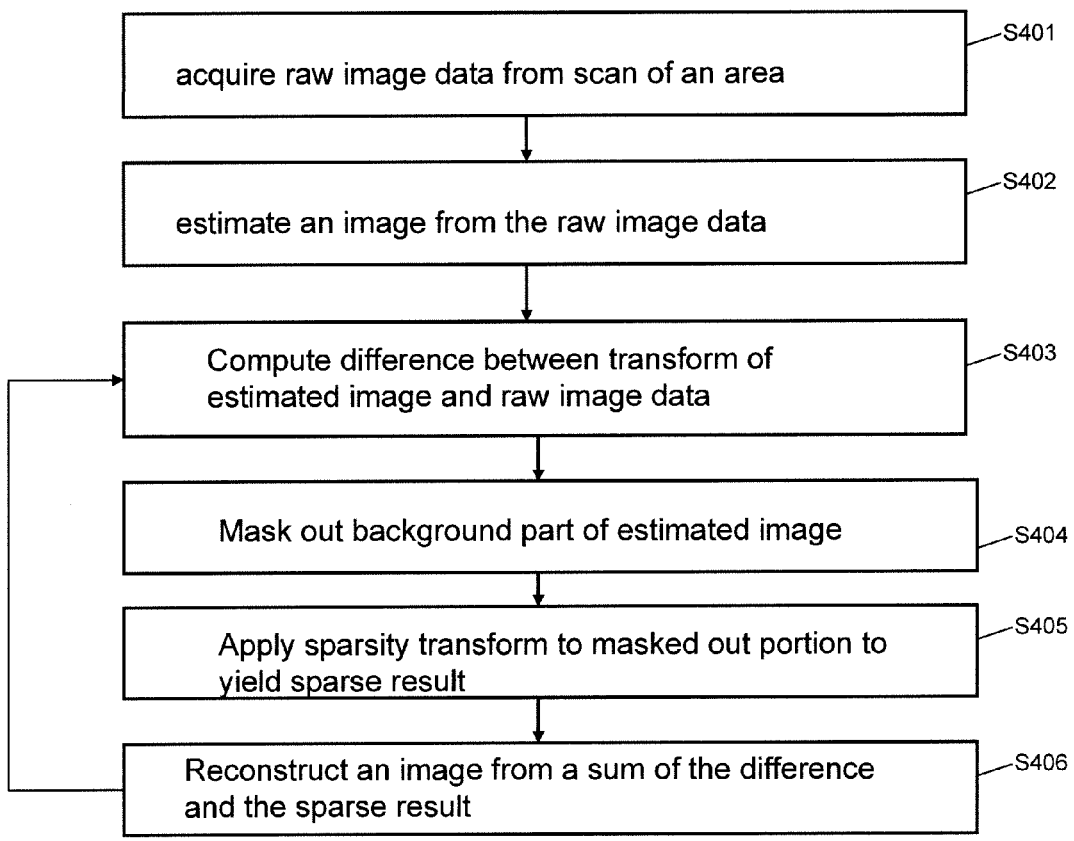
FIG. 4 illustrates a method of reconstructing an image according to an exemplary embodiment of the invention.

FIG. 4 illustrates a method of reconstructing an image according to an exemplary embodiment of the invention. The method of FIG. 4 is considered a regional sparsity approach as well. The method of FIG. 4 is derived from the above equation 5. Referring to FIG. 4, the method includes acquiring raw image data (e.g., gridded or otherwise) during an image scan (e.g., MRI, CT, PET, etc.) of an area (S401). An image is then estimated from the raw image data (S402). A difference is then computed between a transform of the estimated image and the raw image data (S403). If the modality is MRI, the transform can be Fourier, if the modality is CT, the transform can make use of back-projection, etc. The difference may be referred to as the fidelity term.

Next a background part of the estimated image is masked out (S404) and a sparsity transform is applied to the masked out portion to yield a sparse result (S405). The sparse result may be referred to as the sparsity term. The generation of the sparsity term can precede the generation of the fidelity term, or occur at the same or substantially the same time. Next, an image is reconstructed from a sum of the fidelity term and sparsity term (S406). For example, an image is reconstructed as the sum of the previous estimate and the negative gradient of the cost function. Blocks S403-S406 are then re-executed at least once to update the estimated image based on prior estimates to optimize the quality of the image that is ultimately reconstructed.

CS is an iterative process, which is very time consuming. The fidelity term may contain a fast Fourier transform, which is typically quick. The sparsity term contains a sparsity transform, which may be highly complex. The computation complexity depends on the amount of data processed (e.g., the size of the image). If a smaller image can be used, less data needs to be processed, and thus any calculations performed thereon will be faster. At least one embodiment of the invention allows the sparsity transform to be performed only on the region of interest, which has a smaller size than the image. Further, by separating the image into different regions, specific sparsities can be applied to the regions, which best represent the corresponding sparsity, and no compromise is necessary. Accordingly, the sparsity level may be increased and image reconstruction quality may be improved.

In a certain applications, the regional sparsity approach discussed above may perform image reconstruction at least twice as fast as any conventional approach, without significantly reducing image quality.

Figure 5:
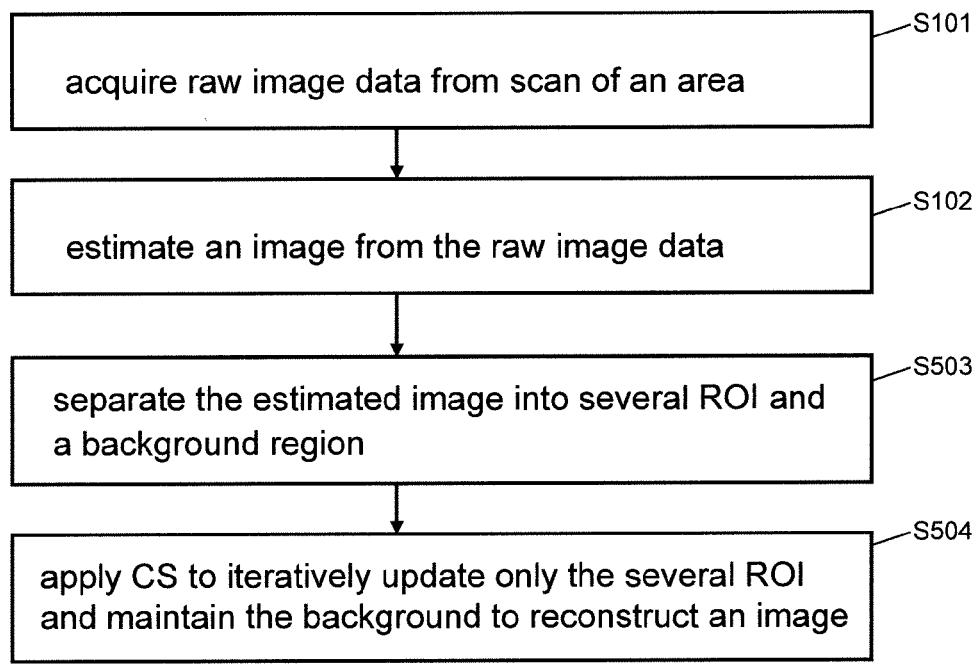
FIG. 5 illustrates a CS approach according to an exemplary embodiment of the inventive.

In a variation of at least one of the above-described embodiments, the estimated image is separated into more than one ROI and the background region. This variation is illustrated by FIG. 5, which shows the same steps of S101 and S102 from FIGS. 1, and S103 and S104 have been replaced with S503 and S504. For example, the method includes separating the estimated image into several ROIs and a single background region (S503) and applying the CS with masks to iteratively update only the several ROIs and maintain the background region to reconstruct an image (S504). A separate and distinct ROI mask may be used to separate out each of the several ROIs from the background region.

In an exemplary embodiment, when the estimated image has been separated into several ROIs, application of CS to update several ROIs may be performed in a manner that uses different sparsity constraints. For example, the CS can apply one sparsity constraint to one of the several ROIs and another sparsity constraint to another one of the ROI. Examples of these sparsity constraints include image domain sparsity, spatial total variance sparsity, wavelets sparsity, etc. For example, in one embodiment, the CS uses image domain sparsity to update a first ROI and spatial total variance sparsity to update the second ROI.

Figure 6:
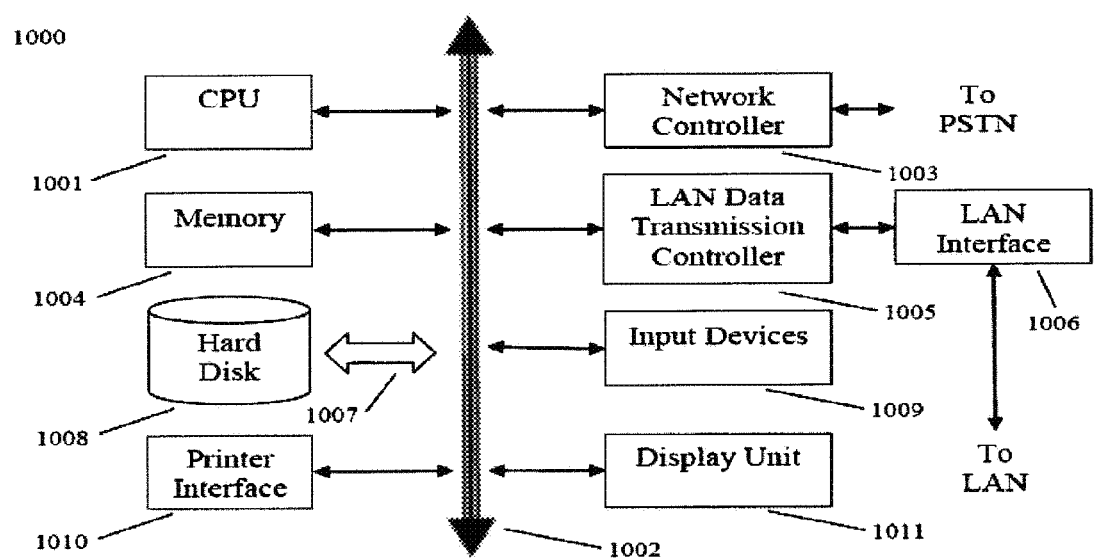
FIG. 6 illustrates an example of a computer system capable of implementing methods and systems according to embodiments of the present invention.

FIG. 6 shows an example of a computer system, which may implement methods and systems of the present disclosure. The system and methods of the present disclosure, or part of the system and methods, may be implemented in the form of a software application running on a computer system, for example, a mainframe, personal computer (PC), handheld computer, server, etc. For example, the method of FIGS. 1 and 4, and 5 may be implemented as software application(s). These software applications may be stored on a computer readable media (such as hard disk drive memory 1008) locally accessible by the computer system and accessible via a hard wired or wireless connection to a network, for example, a local area network, or the Internet.

The computer system referred to generally as system 1000 may include, for example, a central processing unit (CPU) 1001, a GPU (not shown), a random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007. CPU 1001 may be the computer processor that performs some or all of the steps of the methods described above with reference to FIGS. 1, 4, and 5.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention.

What is claimed is:

1. A method for reconstructing an image comprises:
estimating an image from acquired raw image data;
separating the estimated image into a region of interest (ROI) and a background region; and
applying compressed sensing to the ROI while excluding application of the compressed sensing with respect to the background region to iteratively update only the ROI while maintaining the background region, to reconstruct an image,
wherein the applying comprises performing the compressed sensing on a sum of a fidelity term and a sparsity term,
wherein the fidelity term includes a difference between a transform of the estimated image and the raw image data, and
wherein the sparsity term includes a mask multiplied by the estimated image that masks out the background region and retains the ROI.

2. The method of claim 1, wherein the background entirely surrounds the ROI.

3. The method of claim 1, wherein the separating further separates the estimated image into a second ROI distinct from the first ROI, and the applying comprises applying the compressed sensing to iteratively update the first ROI using a first sparsity constraint and iteratively update the second ROI using a second other sparsity constraint.

4. The method of claim 3, wherein one of the two sparsity constraints is image domain sparsity and the other is spatial total variance sparsity.

5. The method of claim 1, wherein prior to the estimating, the method comprises:
acquiring un-gridded image data using a radial trajectory acquisition and oversampling; and
gridding the un-gridded image data to generate the raw image data.

6. The method of claim 1, wherein estimating the image comprises performing an inverse Fourier transform on the raw image data.

7. The method of claim 1, wherein the sparsity term applies a sparsity transform to a result of the mask multiplied by the estimated image.

8. The method of claim 7, wherein the sparsity transform generates a sparse result.

9. The method of claim 1, wherein the mask is a matrix of 1s and 0s, the 0s corresponding to a location of the background region and the 1s corresponding to a location of the ROI.

10. The method of claim 1, wherein a weighting factor is multiplied by the sparsity term.

11. A non-transitory computer readable storage medium embodying instructions executable by a processor to perform method steps for reconstructing an image, the method steps comprising instructions for:
estimating an image from acquired raw image data;
separating the estimated image into a region of interest (ROI) and a background region; and
applying compressed sensing to the ROI while excluding application of the compressed sensing with respect to the background region to iteratively update only the ROI while maintaining the background region, to reconstruct an image,
wherein the applying comprises performing the compressed sensing on a sum of a fidelity term and a sparsity term,
wherein the fidelity term includes a difference between a transform of the estimated image and the raw image data, and
wherein the sparsity term includes a mask multiplied by the estimated image that masks out the background region and retains the ROI.

12. The computer readable medium of claim 11, wherein the background region entirely surrounds the ROI.

13. The computer readable storage medium of claim 11, wherein the separating further separates the estimated image into a second ROI distinct from the first ROI, and the applying comprises applying the compressed sensing to iteratively update the ROI using a first sparsity constraint and iteratively update the second ROI using a second other sparsity constraint.

14. The computer readable storage of claim 11, wherein the instructions further include instructions for:
acquiring un-gridded image data using a radial trajectory acquisition and oversampling; and
gridding the un-gridded image data to generate the raw image data.

15. A method for reconstructing an image comprises:
generating a cost function including a fidelity term and a sparsity term; and
minimizing the generated cost function to generate a reconstructed image,
wherein the fidelity term includes a difference between a transform of an estimated image and raw image data, and
wherein the sparsity term includes a mask multiplied by the estimated image that retains a region of interest (ROI) of the estimated image and masks out a background of the estimated image.

16. The method of claim 15, wherein the minimizing comprises performing compressed sensing on the cost function.

17. The method of claim 15, wherein prior to the generating of the cost function, the method comprises:
acquiring un-gridded image data using a radial trajectory acquisition and oversampling; and
gridding the un-gridded image data to generate the raw image data.

18. The method of claim 5 wherein prior to the generating of the cost function, the method comprises performing an inverse Fourier transform on the raw image data to generate the estimated image.

19. The method of claim 15, wherein the sparsity term applies a sparsity transform to a result of the mask multiplied by the estimated image.

20. The method of claim 15, wherein the background region entirely surrounds the ROI.

* * * * *